United States Patent [19]

Kitayoshi

[11] Patent Number: 4,947,130
[45] Date of Patent: Aug. 7, 1990

[54] IMPEDANCE MEASURING APPARATUS

[75] Inventor: Hitoshi Kitayoshi, Gyoda, Japan

[73] Assignee: Advantest Corporation, Tokyo, Japan

[21] Appl. No.: 284,352

[22] Filed: Dec. 14, 1988

[30] Foreign Application Priority Data

Dec. 23, 1987 [JP] Japan .................................. 62-328276
Jan. 6, 1988 [JP] Japan ..................................... 63-1070
Mar. 9, 1988 [JP] Japan .................................... 63-57150

[51] Int. Cl.$^5$ ....................... G01R 23/16; G01R 27/28
[52] U.S. Cl. ..................................... 324/650; 324/607; 324/603
[58] Field of Search ................. 364/721; 341/117, 110; 324/650, 607

[56] References Cited

U.S. PATENT DOCUMENTS 4,481,464 11/1984 Noguchi ............................ 324/57 R
4,482,974 11/1984 Kovalick ............................. 364/721
4,604,719 8/1986 Stanley .................................. 364/721

FOREIGN PATENT DOCUMENTS 0268447 5/1988 European Pat. Off. .
2305829 8/1974 Fed. Rep. of Germany .

OTHER PUBLICATIONS

Pendergrass; "A High Resolution, Low Frequency Spectrum Analyzer", HP Journal–Sep. 1978–pp. 2–13.
Technisches Messen, vol. 53, No. 6, 1986, pp. 220–228, Muchen, DE; H. Schollmeyer, "Digitale Bruckenschaltungen fur passive Sensoren zur Impedanz-Frequenz-Umsetzung".
Patent Abstracts of Japan, vol. 6, No. 2 (P-96) [880], Jan. 8, 1982 & JP-A-56 126 769 (Yokogawa Hiyuuretsuto Patsukaado K.K.) 05-10-81.
Journal of Physics E: Sci. Instrum., vol. 11, No. 3, Mar. 1978, pp. 237–247, The Institute of Physics, GB; M. R. Boudry: "An Automatic System for Broadband Complex-Admittance Measurements on MOS Structures".
Elektronik, vol. 34, No. 6, Mar. 1985, pp. 69–73, Munich, DE; G. Ramm: "Impedanzmessung mit Wechselspannungskompensator".

Primary Examiner—Gerard R. Strecker
Assistant Examiner—Jose M. Solis
Attorney, Agent, or Firm—Staas & Halsey

[57] ABSTRACT

A digital sine-wave generator, which includes at least one sine waveform memory, is read out by the output of a phase accumulator to generate a first digital sine wave, a second digital sine wave and a digital cosine wave. The first digital sine wave is converted by a D-A converter into an analog signal and then supplied to a measuring object. The output of the measuring object and the second digital sine wave are multiplied in a first multiplying type D-A converter, and the output of the measuring object and the digital cosine wave are multiplied in a second multiplying type D-A converter. The outputs of the first and second multiplying type D-A converters are respectively integrated by first and second integrators for a period which is an integral multiple of the sine wave period.

13 Claims, 9 Drawing Sheets

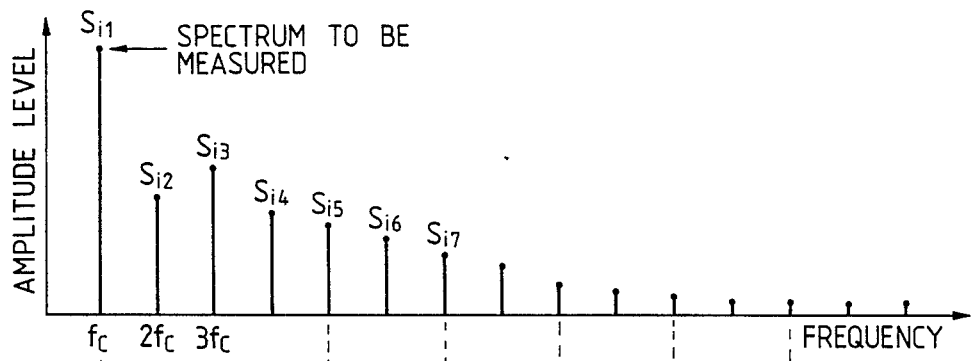
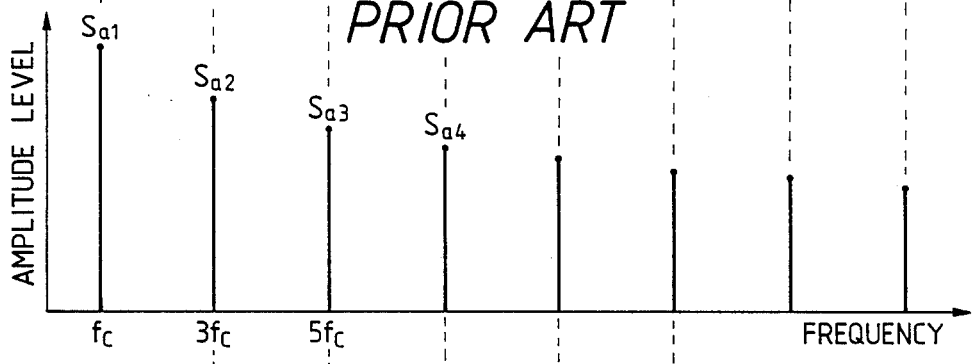
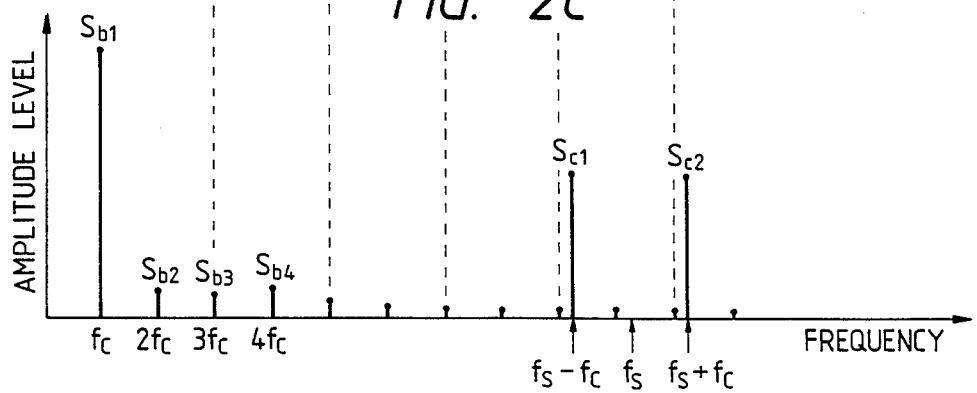

FIG. 4 PRIOR ART
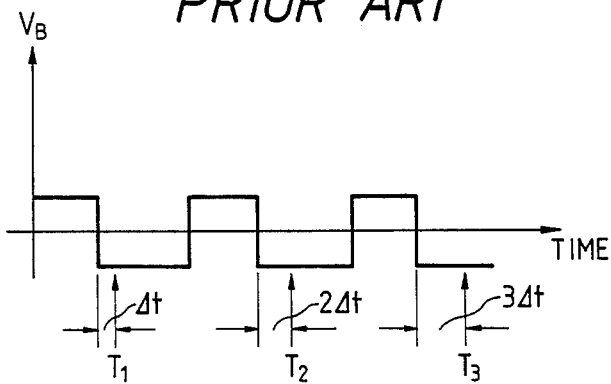
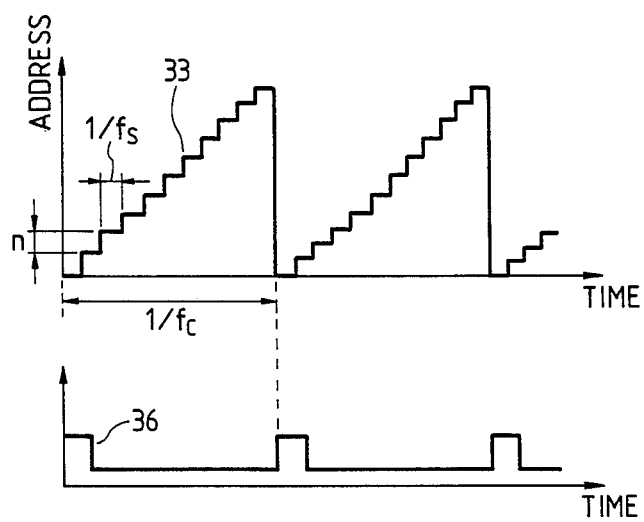
FIG. 5A
FIG. 5B

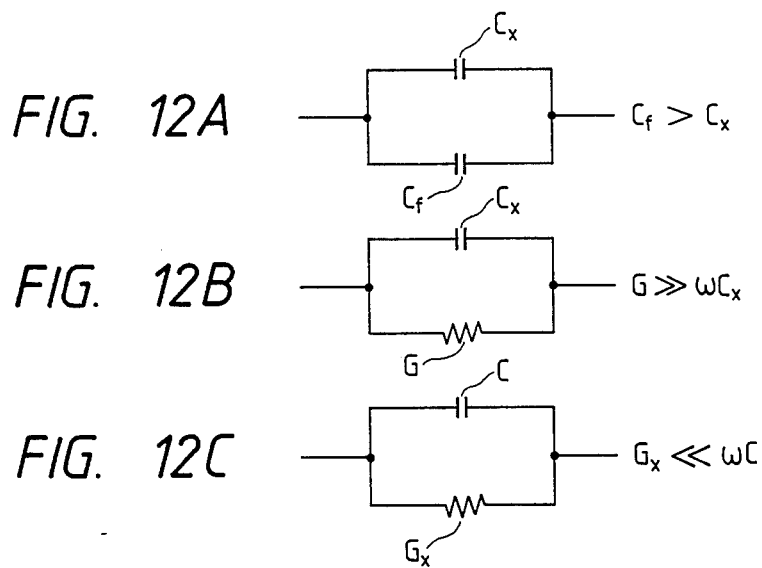
FIG. 12A
FIG. 12B
FIG. 12C
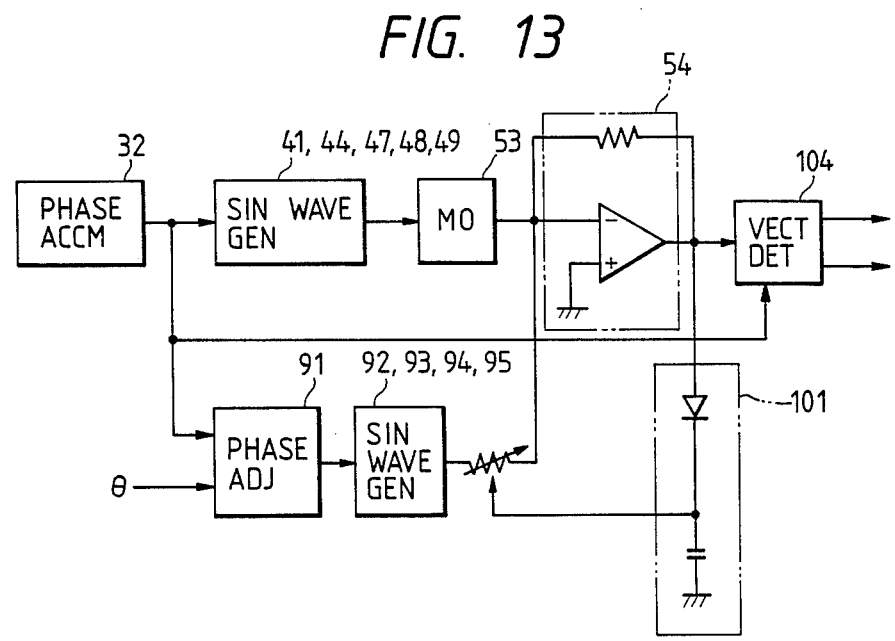
FIG. 13

IMPEDANCE MEASURING APPARATUS

BACKGROUND OF THE INVENTION

The present invention relates to an impedance measuring apparatus which permits high-speed, high-precision measurement of an impedance transfer function of a measuring object at low and even ultra-low frequencies.

FIG. 1 shows in block form a conventional synchronous detection type impedance measuring apparatus, in which a square-wave generator 11 provides 0°-phase and 90°-phase square waves at terminals 12 and 13, respectively. The 0°-phase square wave at the terminal 12 is applied to a low-pass filter 14 to obtain a sine-wave output, which is amplified by an amplifier 15 and then applied to a measuring object 16. The current output $I_x$ of the measuring object 16 is converted by a current-voltage converter 17 into a voltage signal, which is provided to synchronous detectors 18 and 19. The voltage signal is multiplied by the square waves from the terminals 12 and 13 for synchronous detection. The outputs of the synchronous detectors 18 and 19 are integrated by integrators 21 and 22, respectively, to obtain integrated outputs $R_l$ and $I_m$, which are selectively applied to an A-D converter 24 for conversion into digital form. Letting the resistance value of a feedback resistor 25 of the current-voltage converter 17 be represented by R, the A-D converter 24 yields a digital vector voltage $R \cdot I_x = R_l + jI_m$.

Provided that the low-pass filter 14 provides an output $S_{i1}$ of a frequency $f_c$ as shown in FIG. 2A, the measuring object 16 and the current-voltage converter 17 produce distortions $S_{i2}$, $S_{i3}$, . . . as shown in FIG. 2A. On the other hand, the spectrum of a square wave contains relatively large odd higher harmonics as shown in FIG. 2B. Consequently, the above-mentioned distortions are synchronously detected by the higher harmonics in the synchronous detectors 18 and 19 and appear at their outputs. In short, the conventional measuring apparatus has a disadvantage that distortions by the measuring object 16 and the current-voltage converter 17 directly appear as measurement errors.

Another possible impedance measuring apparatus is such as depicted in FIG. 3. The output voltage of a sine-wave generator 26 is applied as an input voltage $V_{in}$ to the measuring object 16, and its current output $I_x$ is converted by the current-voltage converter 17 into a voltage signal, which is further converted by an A-D converter 27 into digital form. The digital signal is subjected to Fourier transformation by a Fourier transformer 28, obtaining an output $S_b$ corresponding to $-R \cdot I_x$. On the other hand, the input voltage $V_{in}$ from the sine-wave generator 26 is converted by an A-D converter 29 into a digital signal, which is Fourier-transformed by a Fourier transformer 31, obtaining an output $S_a$ corresponding to the input voltage $V_{in}$. Thus, $Z_x = V_{in}/I_x = -R \cdot S_a/S_b$ can be obtained.

This impedance measuring apparatus is free from the influence of the distortions by the measuring object 16 and the current-voltage converter 17, but since the A-D converters 27 and 29 convert waveforms into digital signals, they are required to be high-speed and high-precision, and hence are expensive. Further, difficulties are encountered in high-speed operation because of the digital Fourier transformation.

Where an error is contained in the transfer characteristic of the measuring system, a reference element is connected in place of the measuring object 16, the transfer characteristic of the measuring system is measured, and the measured results are used to perform a corrective operation on the output of the A-D converter 24 for the error in the transfer characteristic of the measuring system in the case of the measuring object 16 being connected.

It is customary to learn the physical state of a measuring object at the atomic level by measuring its temporal impedance variations while causing abrupt transient change in bias voltage, magnetic field, temperature etc. In such a case, a very quick transient impedance is measured, but a computing element which performs the above-mentioned corrective operation cannot respond to such a quick transient impedance. The prior art therefore employs a sampling system in which the transient response of the measuring object is repeated and the timing for measurement is shifted little by little accordingly. This sampling system has the defect of consuming much time for measurement.

In the case where a parasitic capacitance 30 is present in the measuring circuit as shown in FIG. 1, it is a general practice in the prior art to measure the output in the absence of the measuring object 16 and subtract the value of this output from a measured value obtained in the presence of the measuring object 16. With this system, however, the range of measurement of the impedance of the measuring object 16 and the accuracy of analysis are limited due to limitations on the dynamic ranges of the current-voltage converter 17, the synchronous detector 18, the integrator 21 and the A-D converter 24. That is, when current flowing through the measuring object 16 is small relative to a parasitic current flowing through the parasitic capacitance 30, the ratio of the parasitic current to the dynamic range of each of the current-voltage converter 17, the synchronous detector 18, the integrator 21 and the A-D converter 24 is large, reducing the accuracy of measurement.

It is therefore an object of the present invention to provide an impedance measuring apparatus in which a measurement error is free from the influence of distortions caused by a measuring object and a current-voltage converter.

Another object of the present invention is to provide an impedance measuring apparatus which is low-cost and capable of high-speed measurement.

Another object of the present invention is to provide an impedance measuring apparatus which permits measurement of a transient impedance in a short time.

Yet another object of the present invention is to provide an impedance measuring apparatus which is capable of high precision measurement without being affected by a parasitic impedance.

SUMMARY OF THE INVENTION

According to the present invention, digital sine-wave generating means including at least one sine waveform memory is read by the output of a phase accumulator, thereby generating a first digital sine wave, a second digital sine wave and a digital cosine wave. The first digital sine wave is converted by a D-A converter into an analog signal, which is applied to a measuring object. The output of the measuring object and the second digital sine wave are multiplied in a first multiplying type D-A converter, and the output of the measuring object and the digital cosine wave are multiplied in a second multiplying type D-A converter. The outputs of the first and second multiplying type D-A converters are integrated by first and second integrators, respectively, for a period which is an integral multiple of the period of the sine wave. Between the phase accumulator and first digital sine-wave generating means or between the phase accumulator and second digital sine-wave generating means a variable phase shifter is provided, and further, amplitude adjusting means is provided for adjusting the amplitude of the analog signal converted from the first digital sine wave.

Phase adjustment data is added by the phase adjusting means to the output of the accumulator and a sine wave having a phase corresponding to the output of the phase adjusting means is produced by third sine-wave generating means. The amplitude of the output sine wave is adjusted by the amplitude adjusting means, and the amplitude-adjusted sine wave is supplied to a current-voltage converter, wherein it is added to the current output of the measuring object.

BRIEF DESCRIPTION OF THE DRAWINGS

FIG. 2A is a graph showing of the output spectrum of a current-voltage converter used in FIG. 1;

FIG. 2B is a graph of the spectrum of a rectangular wave in FIG. 1;

FIG. 2C is a graph of the spectrum of the output of a sine waveform memory employed in the present invention;

FIG. 4 is a graph, for explaining the measurement of a transient impedance according to the prior art;

FIG. 5A is a diagram illustrating variation in address 5A generated by a phase accumulator 32;

FIG. 5B is a diagram of an overflow signal 5B generated by the phase accumulator 32;

FIGS. 12A to 12C are diagrams showing various examples of an impedance to be measured and a parasitic impedance; and FIG. 13 is a block diagram of a partially modified form of the embodiment depicted in FIG. 11.

DESCRIPTION OF THE PREFERRED EMBODIMENTS

Figure 5:
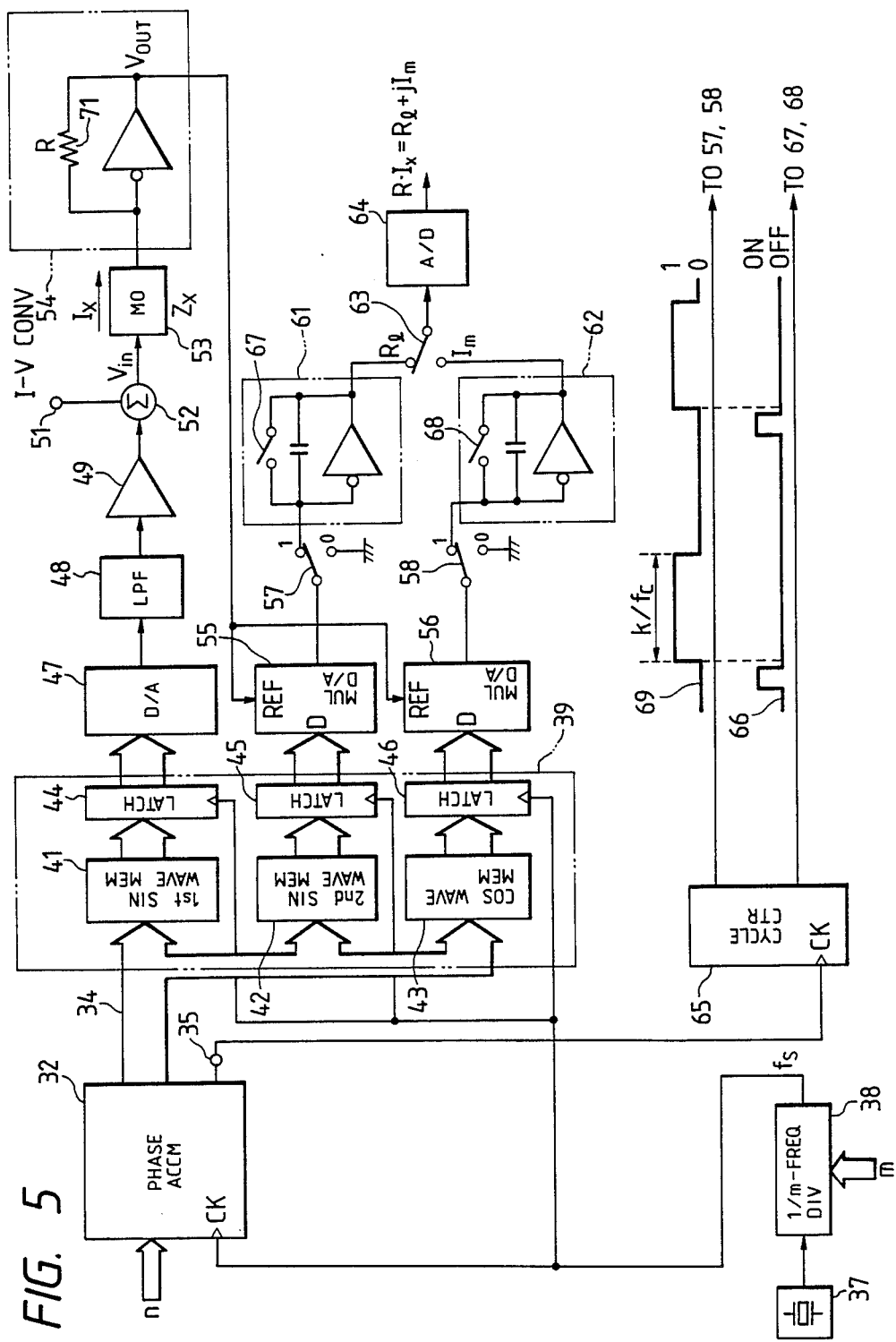
FIG. 5 is a block diagram of a first embodiment of the present invention.

FIG. 5 illustrates in block form a first embodiment of the present invention, in which a phase accumulator 32 is provided. Upon each application of a clock, the phase accumulator 32 cumulatively adds a digital value n applied thereto and outputs a digital value shown as an analog waveform 33 in FIG. 5A to an address bus 34, and upon each occurrence of an overflow of its internal accumulator, the phase accumulator 32 outputs a pulse 36 to a terminal 35 as shown in FIG. 5B. The output of an oscillator 37 is frequency divided by a variable frequency divider 38 down to 1/mth thereof, and a clock of the divided frequency $f_s$ is applied to the phase accumulator 32.

The output of the accumulator 32 to the address bus 34 is applied to a digital sine-wave generator 39. The digital sine-wave generator 39 in this example is provided with a first sine waveform memory 41, a second sine waveform memory 42 and a cosine waveform memory 43. Digital values from the address bus 34 are provided as addresses to the memories 41, 42 and 43 to read out their stored contents, which are loaded by the clock into latch circuits 44, 45 and 46.

The output of the latch circuit 44 is converted by a D-A converter 47 into an analog signal, which is applied to a low-pass filter 48 and is then amplified by an amplifier 49, as required. The analog signal is provided to an adder 52, wherein it is added, as required, with a DC bias from a terminal 51, and the added output is supplied as an input to a measuring object 53. The output current $I_x$ of the measuring object 53 is converted by a current-voltage converter 54 into a voltage output $V_{out}$.

The voltage output $V_{out}$ is applied as an analog reference voltage to each of first and second multiplying type D-A converters 55 and 56. The first and second multiplying type D-A converters 55 and 56 are supplied at their data input terminals with the outputs of the latch circuits 45 and 46. The outputs of the first and second multiplying type D-A converters 55 and 56 are provided to first and second integrators 61 and 62 via switches 57 and 58, respectively. The outputs of the first and second integrators 61 and 62 are provided via a change-over switch 63 to an A-D converter 64.

The pulses provided at the terminal 35 of the phase accumulator 32 are counted by a cycle counter 65, and by the output 66 of the cycle counter 65, reset switches 67 and 68 of the first and second integrators 61 and 62 are turned ON for a short period of time, thereby resetting the integrators 61 and 62. For a predetermined period of time $k/f_c$ (where $f_c$ is the frequency of the pulse 36 and k is an integer) after the resetting, the switches 57 and 58 connect, by the output 69 of the counter 65, the output sides of the first and second multiplying type D-A converters 55 and 56 to the first and second integrators 61 and 62. In the time interval between the trailing edge of the output 69 and an instant immediately before the reset pulse 66 the outputs of the first and second integrators 61 and 62 are converted by the A-D converter 64 to digital values.

The outputs of the first and second multiplying type D-A converters 55 and 56 are as follows:

$V_{out}(t)Sin(\omega t)$ and $V_{out}(t)Cos(\omega t)$ where $\omega = 2\pi f_c$. The outputs of the first and second integrators 61 and 62 are as follows:

$$R_l = \int_{t_1}^{t_2} V_{out}(t)\mathrm{Sin}(\omega t)dt$$

and $$I_m = \int_{t_1}^{t_2} V_{out}(t)\mathrm{Cos}(\omega t)dt.$$

By selecting the integration time so that $t_2-t_1=k/f_c$, the outputs $R_l$ and $I_m$ resulting from the Fourier transformation of the output $V_{out}$ are obtained. The output $R_l+jI_m$ of the A-D converter 64 is proportional to the current $I_x$ flowing through the measuring object 53.

$$V_{out} = R \cdot I_x = R_l + jI_m$$

where R is the resistance value of a feedback resistor 71 of the current-voltage converter 54. Consequently, the impedance $Z_x$ of the measuring object 53 can be obtained as follows:

$$Z_x = R \cdot \frac{V_{in}}{R + jI_m} \cdot \dot{a}$$

where $V_{in}$ is the amplitude of the sine wave which is fed to the measuring object 53 and $\dot{a}$ is a corrective vector of the measuring system.

The signals for detecting the output $V_{out}$ of the current-voltage converter 54, that is, the outputs of latch circuits 45 and 46, have such spectra as shown in FIG. 2C. A spectrum $S_{b1}$ which coincides with the spectrum $S_{i1}$ in FIG. 2A of the output from the measuring object 53 is a component effective for detection. Spectra $S_{b2}$, $S_{b3}$, ... coincide with those of distortions by the measuring object 53 and the current-voltage converter 54 and appear as measurement errors, but they are very small, usually 1/1000 or less, and hence they are not so serious. Spectra $S_{c1}$ and $S_{c2}$ are unwanted spectra which occur at a frequency $mf_s \pm f_c$ (where m=1, 2, ...). When a ratio $f_s/f_c$ is set to a fraction, for instance, 10.24, then these spectra will not appear as measurement errors, because they do not coincide with the spectra of distortions by the measuring object 53 and the current-voltage converter 54. In the case where the integration period $t_2-t_1$ is not set to an integral multiple of $1/f_c$ and an integral multiple of $1/f_s$, for example, $400/f_c = 4096/f_s$, the spectral components $S_{c1}$ and $S_{c2}$ are observed as truncation errors in the Fourier transformation. The truncation error decreases in inverse proportion to the integer k in the integration period $t_2-t_1=k/f_c$ and the ratio $f_s/f_c$, and consequently, the error is less than 0.1% when $f_s/f_c=10.24$ and $k=10$, for example.

The transfer function of the measuring object 53 can be measured by employing a voltage-voltage converter in place of the current-voltage converter 54 in FIG. 5.

Figure 6:
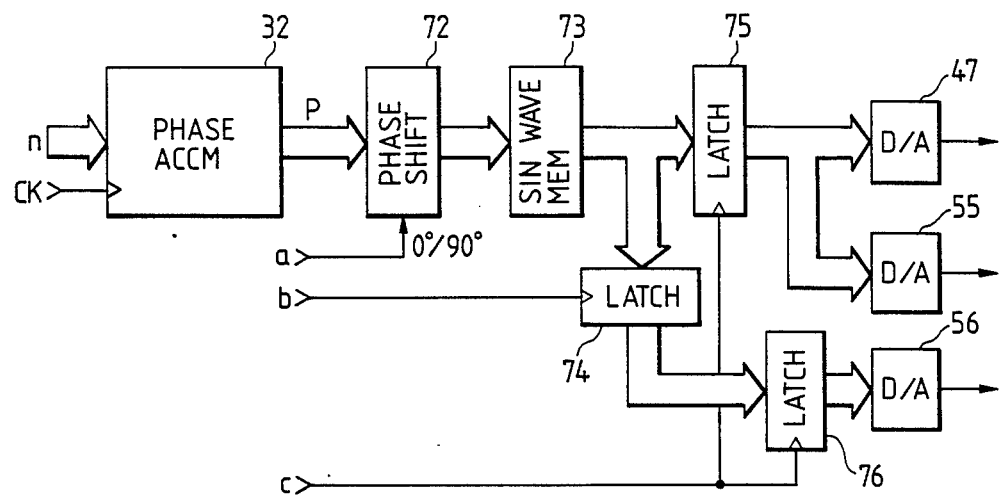
FIG. 6 is a block diagram showing a modification of digital sine-wave generating means 39 used in FIG. 5.
Figure 7:
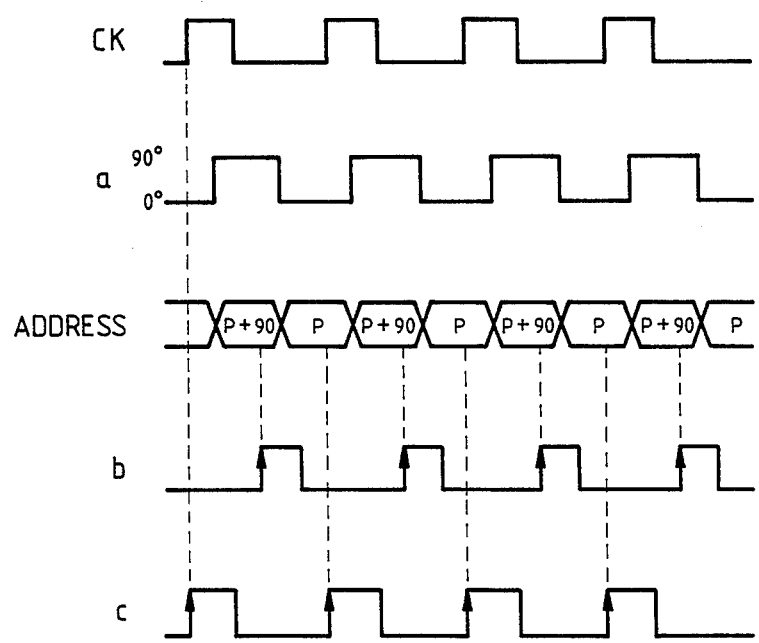
FIG. 7 is a waveform diagram, for explaining the operation of the modified digital sine-wave generating means depicted in FIG. 6.

The digital sine-wave generating means 39 in FIG. 5 may also be constructed as shown in FIG. 6. The output P of the phase accumulator 32 is applied to a phase shifter 72, from which 0°- and 90°-shifted outputs are provided alternately with each other as depicted in FIG. 7a. These outputs are applied as addresses to a sine waveform memory 73, from which a sine wave of a 0° phase angle and a sine wave leading it by a phase angle of 90°, i.e. a cosine wave, are read out alternately. The cosine wave is latched in a latch circuit 74 by a pulse shown in FIG. 7b. The sine wave is latched in a latch circuit 75 by a pulse shown in FIG. 7c, and at this time, the output of the latch circuit 74 is latched in a latch circuit 76. The output of the latch circuit 75 is provided to the D-A converter 47 and the first multiplying type D-A converter 55, whereas the output of the latch circuit 76 is provided to the second multiplying type D-A converter 56.

The output $R_l$ of the first integrator 61 in FIG. 5 is a conductance component of the impedance $Z_x$ of the measuring object 53, and the output $I_m$ of the second integrator 62 is a receptance component. These outputs $R_l$ and $I_m$ may also be observed directly on an oscilloscope.

Figure 8:
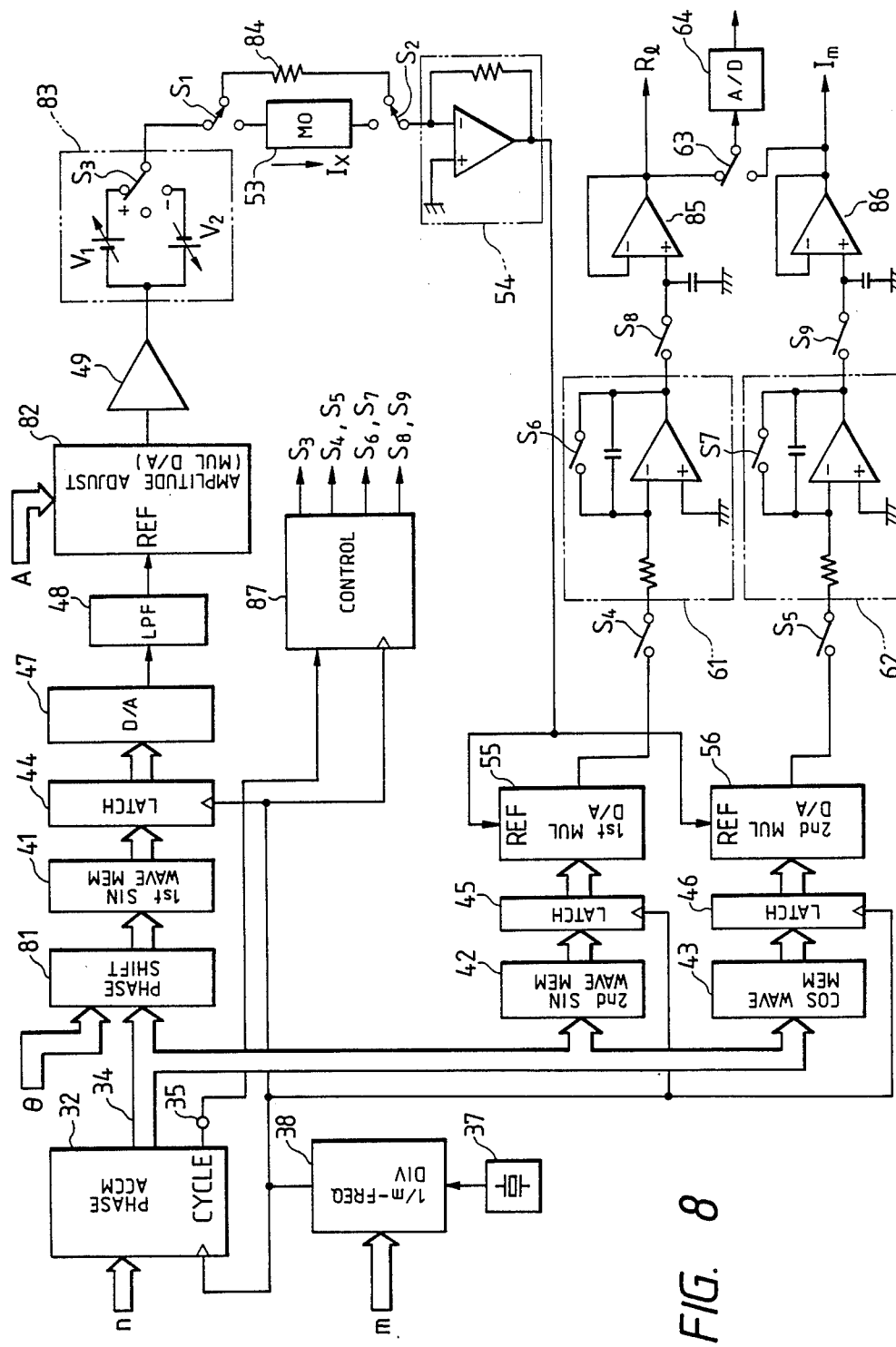
FIG. 8 is a block diagram of a second embodiment of the present invention.

FIG. 8 illustrates another embodiment of the present invention, in which the parts corresponding to those in FIG. 5 are identified by the same reference numerals. In this embodiment the output at the terminal 34 of the phase accumulator 32 is added to phase shift data $\theta$ in a variable phase shifter 81 and then supplied to the first sine waveform memory 41. The output of the low-pass filter 48 is applied to the amplifier 49 after being multiplied by amplitude data A in a multiplying type D-A converter 82 which serves as phase adjust means. The output of the amplifier 49 is provided to a DC bias select circuit 83, the output of which is, in turn, applied to a selected one of the measuring object 53 and a reference element 84 via a change-over switch $S_1$. The output currents of the measuring object 53 and the reference element 84 are selectively applied via a switch $S_2$ to the current-voltage converter 54 for conversion into voltage form. The outputs of the multiplying type D-A converters 55 and 56 are supplied via switches $S_4$ and $S_5$ to the integrators 61 and 62, respectively. The outputs of the integrators 61 and 62 are sample-held in sample hold circuits 85 and 86, the outputs of which are, in turn, selectively fed to the A-D converter 64 via a switch 63.

Figure 9:
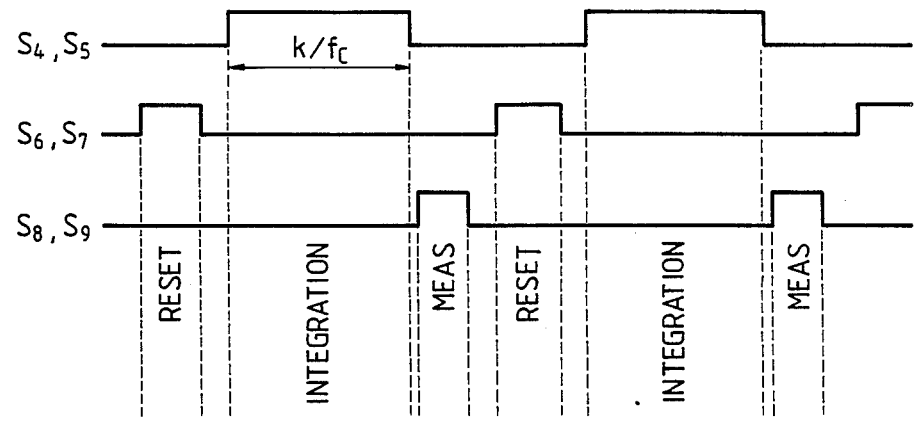
FIG. 9 is a timing chart showing the operation of a control section 87 of FIG. 8.

A switch $S_3$ of the DC bias select circuit 83 is controlled by the output of a control section 87, and as shown in FIG. 9, reset switches $S_6$ and $S_7$ of the first and second integrators 61 and 62 are temporarily turned ON to initialize them, after which the switches $S_4$ and $S_5$ are turned ON to perform the integration for the period $k/f_c$ (where k is an integer). Then switches $S_8$ and $S_9$ are temporarily turned ON, sample-holding the integrated outputs of the integrators 61 and 62.

In a calibration mode, the switches $S_1$ and $S_2$ are connected to the reference element 84. The reference element 84 is a pure resistance element of a preknown resistance value Zr. In this state, the phase shift data $\theta$ is provided to the variable phase shifter 81 and the phase of the sine wave which is applied to the reference element 84 is controlled by adjusting the phase shift data $\theta$ so that the susceptance component $I_m$ available from the second integrator 62 is reduced to zero. Further, the amplitude data A which is input into the multiplying type D-A converter 82 serving as amplitude adjust means is controlled, by which the amplitude of the sine wave to be applied to the reference element 84 is controlled, so that the conductance component $R_l$ available from the first integrator 61 assumes a predetermined value a/Zr (where a is a real number).

In this way, the corrective vector angle is reduced to zero, and consequently, by connecting the switches $S_1$ and $S_2$ to the measuring object 53 in a measurement mode, the conductance Gx and the capacitance Cs of the measuring object 53 are directly read as $G_x = R_l/a$ and $C_x = I_m/a\omega$, respectively, where $\omega$ is the angular frequency of a test signal and a is a proportional coefficient which is determined in the calibration mode.

Figure 10:
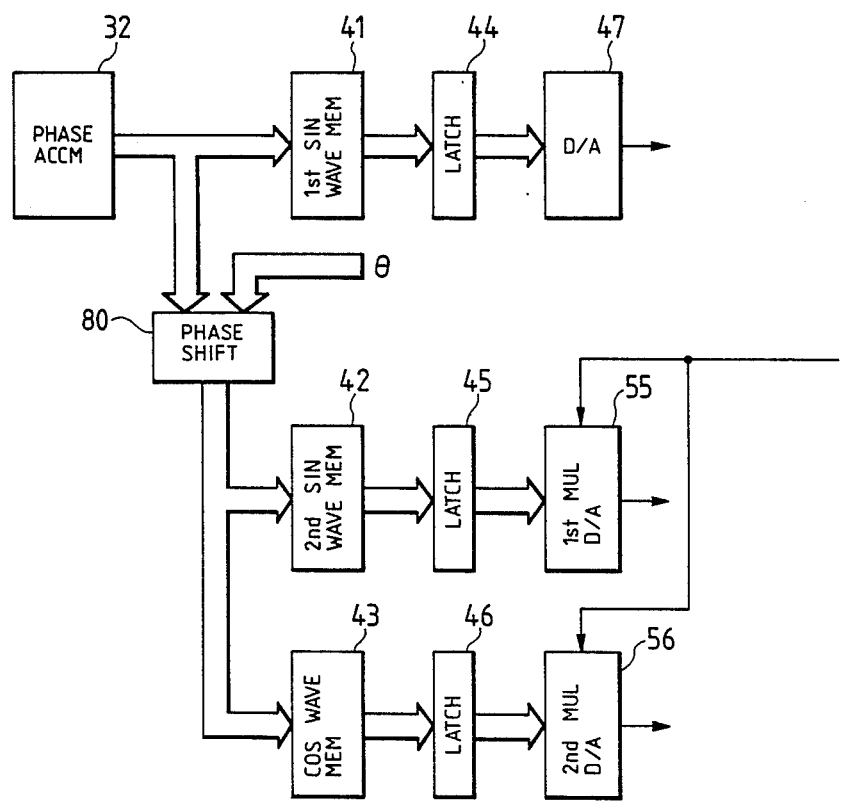
FIG. 10 is a block diagram of a partially modified form of the embodiment depicted in FIG. 8.

FIG. 10 illustrates a modified form of the embodiment depicted in FIG. 8. In FIG. 10 the output of the phase accumulator 32 is fed directly to the first sine waveform memory 41 and it is provided via a variable phase shifter 80 to the second sine waveform memory 42 and the cosine waveform memory 43.

Figure 11:
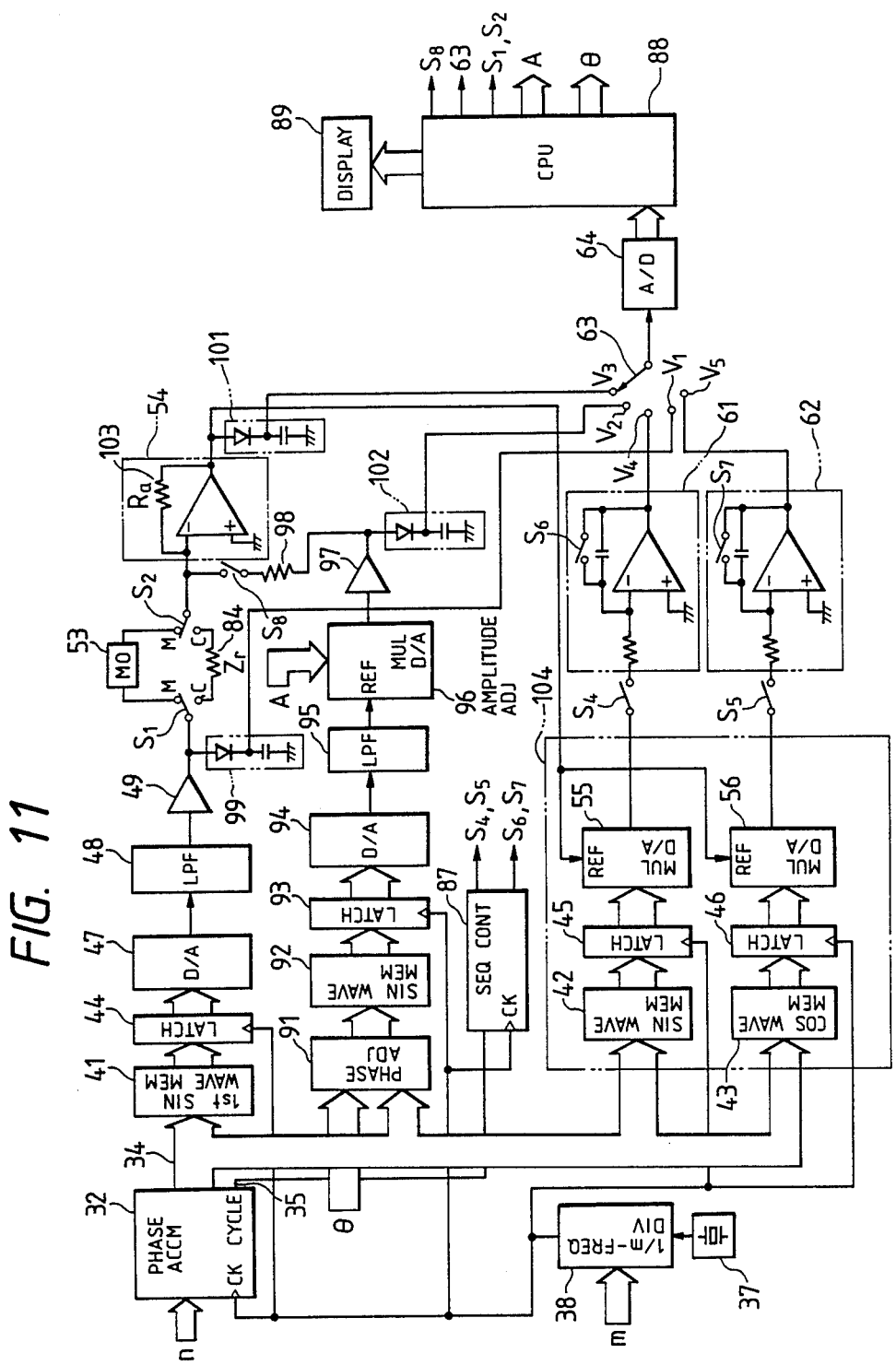
FIG. 11 is a block diagram of a third embodiment of the present invention.

FIG. 11 illustrates another embodiment of the present invention, in which the parts corresponding to those in the foregoing embodiments are identified by the same reference numerals. The output of the A-D converter 64 is provided to a controller (a CPU) 88, through which it is displayed on a display 89 as required.

The output of the phase accumulator 32 is supplied to a phase adjuster (a phase shift adder) 91, wherein it is added with phase adjust data $\theta$. The output of the phase adjuster 91 is applied as an address to a sine waveform memory 92, and the read output of which is latched in a latch circuit 93 by the output clock of the frequency divider 38. The output of the latch circuit 93 is converted by a D-A converter 94 into an analog signal, which is applied via low-pass filter 95 to a reference input of a multiplying type D-A converter 96 forming an amplitude adjust means. The multiplying type D-A converter 96 is supplied at its digital input with amplitude adjust data A, and the input analog signal is amplitude-adjusted and then output. This output is supplied to the input of the current-voltage converter 54 via an amplifier 97, a resistor 98 and a switch $S_8$.

The outputs of the amplifier 49, the current-voltage converter 54 and the amplifier 96 are detected by detectors 99, 101 and 102, respectively, and their output levels are provided to the A-D converter 64 via the change-over switch 63. By the output of the CPU 88 the switches $S_1$, $S_2$, $S_8$ and 63 are controlled and the amplitude adjust data A and the phase adjust data $\theta$ are controlled.

Next, a description will be given of procedures for measurement in various cases. In the case where the measuring object 53 is a capacitance element and its capacitance $C_x$ is smaller than a parasitic capacitance $C_f$ of the measuring system as shown in FIG. 12A, the measuring object 53 is removed to provide an open circuit state, the switches $S_1$ and $S_2$ are connected to the side M, the switch $S_8$ is turned ON and then the phase adjust data $\theta$ and the amplitude adjust data A are adjusted by the CPU 88 so that the outputs $V_4$ and $V_5$ of the integrators 61 and 62 are reduced to zero. As a result of this, the vector of current flowing across the parasitic capacitance $C_f$ is cancelled by the output current of the amplifier 97. By connecting the measuring object 53 in this state, only current flowing across the measuring object 53 will be converted by the current-voltage converter 54 into voltage.

In the case where a parasitic conductance G is connected in parallel to the capacitance $C_x$ desired to be evaluated and $G >> \omega C$ (where $\omega$ is the measuring angular frequency) as shown in FIG. 12B, the switches $S_1$ and $S_2$ are connected to the side C and the switch $S_8$ is turned ON. The phase adjust data $\theta$ and the amplitude adjust data A are controlled by the CPU 88 so that the outputs $V_4$ and $V_5$ of the integrators 61 and 62 are both reduced to zero. In other words, the state in which the angle of the current vector is zero is detected. Let the phase adjust data $\theta$ and the amplitude adjust data A at that time be represented by $\theta_0$ and $A_0$, respectively. Next, the switches $S_1$ and $S_2$ are connected to the side M (i.e. the measuring object 53 side) and only the amplitude adjust data A is adjusted by the CPU 88 so that the output $V_3$ of the current-voltage converter 54 becomes sufficiently small. That is, current by the component of the parasitic conductance G is cancelled by the output of the amplifier 97. From the outputs $V_4$ and $V_5$ of the integrators 61 and 62 which are observed at this time, the capacitance $C_x$ and the parasitic conductance G are obtained as follows:

$$C_x = \frac{V_5}{V_1 \cdot K \cdot R_a \cdot \omega}$$

and $$G = \frac{V_4}{V_1 \cdot R_a \cdot K} + \frac{1}{Z_r} \cdot \frac{A}{A_0}$$

where $V_1$ is the output level of the amplifier 49, K is a detection.integration gain, $R_a$ is the resistance value of a feedback resistor 103 of the current-voltage converter 54 and $Z_r$ is the resistance value of the reference resistance element 84. If the amplitude adjust data A is so adjusted as to minimize the output $V_3$, then the output $V_4$ of the integrator 61 will be substantially zero and the parasitic conductance G will be given as follows:

$$G = \frac{1}{Z_r} \cdot \frac{A}{A_0}.$$

In the case where a parasitic capacitance C and a conductance $G_x$ desired to be evaluated are connected in parallel and $G_x >> \omega C$ as shown in FIG. 12C, the switches $S_1$ and $S_2$ are connected to the side C, the switch $S_8$ is turned ON and the phase adjust data $\theta$ and the amplitude adjust data A are controlled by the CPU 88 so that the outputs $V_4$ and $V_5$ of the integrators 61 and 62 are reduced to zero. That is, the state in which the angle of the current vector is zero is obtained. Let the phase adjust data $\theta$ and the amplitude adjust data A at this time be represented by $\theta_0$ and $A_0$, respectively. The switches $S_1$ and $S_2$ are changed over to the side M and the phase adjust data is set to $\theta_0 + 90°$. Only the amplitude data A is adjusted by the CPU 88 to make the integrator output $V_3$ sufficiently small. In other words, current flowing across the parasitic capacitance C is cancelled by the output of the amplifier 97. From the integrator outputs $V_4$ and $V_5$ which are observed at this time, the conductance $G_x$ and the parasitic capacitance C are obtained as follows:

$$G_x = \frac{V_4}{V_1 \cdot R_a \cdot K}$$

and $$C = \frac{V_5}{V_1 \cdot R_a \cdot K \cdot \omega} + \frac{1}{Z_r \cdot \omega} \cdot \frac{A}{A_0}.$$

Letting the number of bits of the phase accumulator 32, the set value of phase increment data and the frequency of the input clock of the phase accumulator 32 be represented by m, $n_I$ and $f_s$ (Hz), the measuring angular frequency $\omega$ becomes as follows:

$$\omega = \frac{n_1}{2^m} \cdot 2\pi f_s \text{ (rad/sec)}.$$

By changing the set value $n_1$ and the measuring angular frequency $\omega$ can be varied. Letting the number of bits of the phase adjust data and the number of bits of the phase adjust means (the phase shift adder) 91 be represented by $n_2$ and r, respectively, the phase shift amount $\theta$ becomes as follows:

$$\theta = \frac{n_2}{2^r} \times 360 \text{ (deg)}.$$

Thus, the phase can be adjusted with high resolution and with high precision.

It is also possible to control the amplitude value of the current adding vector by analog feedback as shown in FIG. 13; namely, the current-voltage conversion coefficient is controlled by the output of the detector 101 so that the output is minimized.

Figure 1:
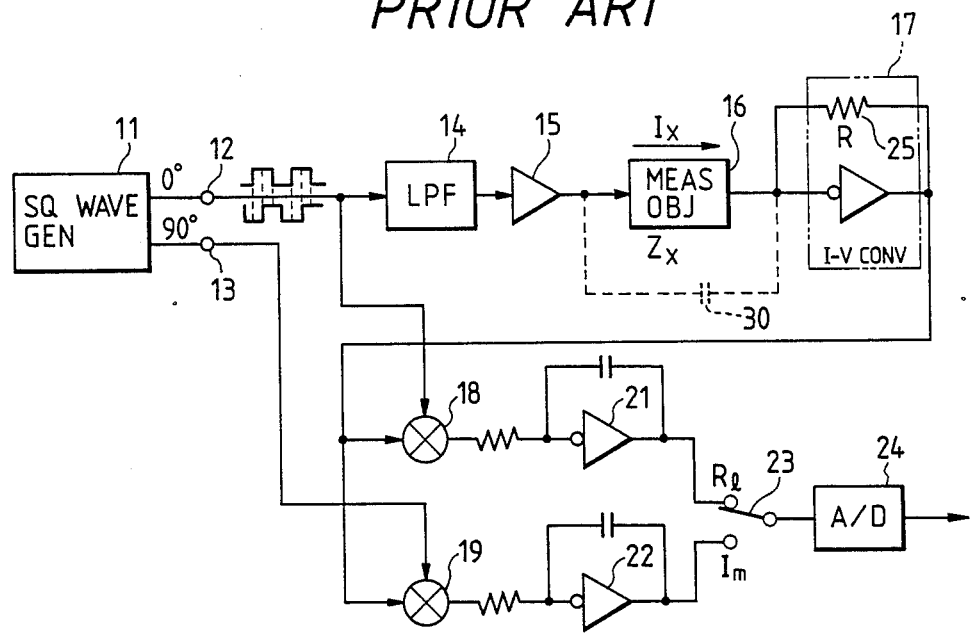
FIG. 1 is a block diagram of a conventional impedance measuring apparatus.
Figure 3:
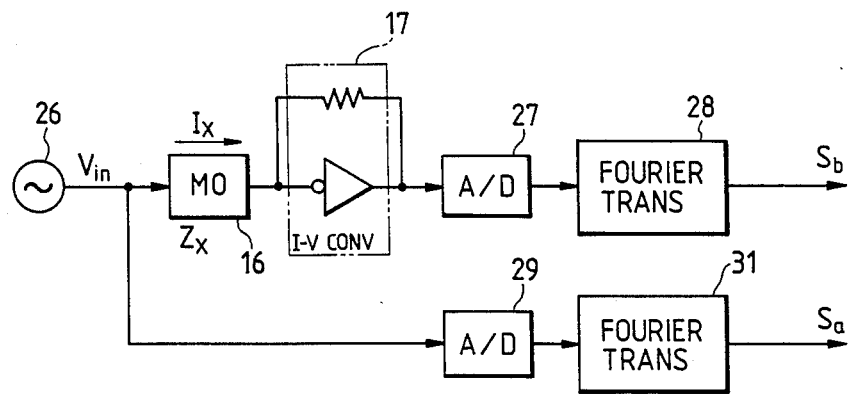
FIG. 3 is a block diagram of a possible impedance measuring apparatus based on the prior art.

As described above, the impedance measuring apparatus of the present invention does not employ any high-speed, high-precision A-D converters, and hence is less expensive than the conventional apparatus shown in FIG. 3. The apparatus of the present invention does not call for the digital Fourier transformation, and hence operates at high speed. Moreover, the apparatus of the present invention permits high precision measurement, because it is free from the influence of distortion caused by the measuring object and the current-voltage converter. According to the prior art depicted in FIG. 1, the pass characteristic of the low-pass filter 14 must be changed for making the measuring frequency variable, and it is difficult to make the measuring frequency variable. According to the present invention, however, even if the measuring frequency is changed, the spectra $S_{c1}$ and $S_{c2}$ in FIG. 2C vary only slightly. Consequently, the filter characteristic of the filter for removing them need not be made variable and the measuring frequency $f_c$ can easily be changed.

Besides, according to the embodiment of the present invention shown in FIG. 8, in the calibration mode, a phase shifter 81 or 80 is controlled to adjust the output of the phase accumulator 32, and its amplitude is adjusted by the amplitude adjust means 82, compensating the transfer characteristic of the measuring system. By this, the admittance of the measuring object 53 is measured without the need of correcting the outputs of the first and second integrators 61 and 62. Since no correction by operation is needed, a transient response of impedance can be measured.

According to the embodiment shown in FIG. 11, the parasitic current is cancelled by adding the phase-adjusted current and the amplitude-adjusted current at the input side of the current-voltage converter 54, the current-voltage converter 54 and the vector detecting means 104 are supplied with only the current desired to be measured, and consequently, its dynamic range can be utilized effectively, permitting high precision measurement.

It will be apparent that many modifications and variations may be effected without departing from the scope of the novel concepts of the present invention.

What is claimed is:

1. An impedance measuring apparatus for measuring the impedance of a measuring object, comprising:

a phase accumulator for repeatedly adding a given value to produce, as an output, a series of digital values, repeatedly;

digital sine wave generating means which includes waveform memory means which is read at a sampling frequency using, as addresses, the digital values output from said phase accumulator to generate successive sample values of a first digital sine wave, successive sample values of a second digital sine wave, and successive sample values of a digital cosine wave;

a D-A converter, coupled to said digital sine wave generating means, for converting the successive sample values of the first digital sine wave into an analog signal at the sampling frequency for supply to the measuring object, the measuring object producing an output in response to the analog signal;

a first multiplying type D-A converter, coupled to said digital sine wave generating means and the measuring object, for multiplying the output of the measuring object and the successive sample values of the second digital sine wave to produce an output;

a second multiplying type D-A converter, coupled to said digital sine wave generating means and the measuring object, for multiplying the output of the measuring object and the successive sample values of the digital cosine wave to produce an output;

a first integrator, coupled to said first multiplying type D-A converter, for integrating the output of said first multiplying type D-A converter for a period of time which is an integral multiple of the sine wave period; and a second integrator, coupled to said second multiplying type D-A converter, for integrating the output of said second multiplying type D-A converter for a period of time which is an integral multiple of the sine wave period.

2. The impedance measuring apparatus of claim 1, wherein said digital sine wave generating means comprises:

a first sine waveform memory, coupled to said phase accumulator and said D-A converter, which is read out by the output of said phase accumulator to generate the first digital sine wave;

a second sine waveform memory, coupled to said phase accumulator and said first multiplying type D-A converter, which is read out by the output of said phase accumulator to generate the first digital sine wave;

a second sine waveform memory, coupled to said phase accumulator and said first multiplying type D-A converter, which is read out by the output of said phase accumulator to generate the second digital sine wave; and a cosine waveform memory, coupled to said phase accumulator and said second multiplying type D-A converter, which is read out by the output of said phase accumulator to generate the digital cosine wave.

3. The impedance measuring apparatus of claim 2, further including:

variable phase shifter means, coupled between said phase accumulator and said first sine waveform memory, for adding a desired phase value to the output of said phase accumulator to be applied to said first sine waveform memory; and amplitude adjust means, coupled to the output of said D-A converter, for adjusting the amplitude of the analog signal.

4. The impedance measuring apparatus of claim 3, wherein said amplitude adjust means is a multiplying type D-A converter which multiplies the analog signal by amplitude data.

5. The impedance measuring apparatus of claim 2, further including:
variable phase shifter means, coupled between said phase accumulator and said second sine waveform and cosine waveform memories; and
amplitude adjust means, coupled to the output of said D-C converter, for adjusting the amplitude of the analog signal.

6. The impedance measuring apparatus of claim 5, wherein said amplitude adjust means is a multiplying type D-A converter which multiplies the analog signal by amplitude data.

7. The impedance measuring apparatus of claim 1, wherein said digital sine wave generating means comprises:
a phase shifter, coupled to said phase accumulator, for phase shifting the output of said phase accumulator to 0° and 90° outputs;
a sine waveform memory coupled to said phase shifter, which is read out by the output of said phase shifter to produce an output;
a first latch, coupled to said sine waveform memory, for latching the output of said sine waveform memory which is read out by the 90° output;
a second latch, coupled to said sine waveform memory, said D-A converters and said first multiplying type D-A converter, for latching the output of said sine waveform memory which is read out by the 0° output; and
a third latch, coupled to said first latch and said second multiplying type D-A converter, for latching the output of said first latch in synchronism with the latching of the output of said sine waveform memory into said second latch.

8. The impedance measuring apparatus of claim 1, further including a current-voltage converter, coupled to the measuring object and said first and second multiplying type D-A converters, which converts the output current of the measuring object into a voltage for supply to said first and second multiplying D-A converters as the output of the measuring object.

9. The impedance measuring apparatus of claim 8, further including:
phase adjust means for adding phase adjust data to the output of said phase accumulator;
cancelling sine wave generating means for generating a cancelling sine wave having a phase corresponding to the output of said phase adjust means;
amplitude adjust means for adjusting the amplitude of the cancelling sine wave of said cancelling sine wave generating means; and
adding means for supplying the output of said amplitude adjust means to the input of said current-voltage converter for cancelling a parasitic current in the output current of the measuring object.

10. The impedance measuring apparatus of claim 9, wherein said D-A converter is a first D-A converter and wherein said cancelling sine wave generating means includes:

a sine waveform memory, coupled to said phase adjust means, which is read out by the output of said phase adjust means; and
a second D-A converter, coupled to said sine waveform memory and said amplitude adjust means, for converting the output of said sine waveform memory into an analog signal corresponding to the cancelling sine wave.

11. The impedance measuring apparatus of claim 9, further including:
a first detector, coupled to said D-A converter, for detecting the output level of said D-A converter;
a second detector, coupled to said current voltage converter, for detecting the output level of said current-voltage converter; and
a third detector, coupled to said cancelling sine wave generating means, for detecting the output level of said cancelling sine wave generating means.

12. An impedance measuring apparatus for measuring the impedance of a measuring object, comprising:
a phase accumulator for providing an accumulative output;
a digital sine-wave generator, coupled to said phase accumulator, for generating a first digital sine wave, a second digital sine wave and a digital cosine wave based on the accumulative output;
a D-A converter, coupled to said digital sine-wave generator, for converting the first digital sine wave into a first analog signal which is supplied to the measuring object, the measuring object producing a measured signal in response to the analog signal;
a first multiplying type D-A converter, coupled to said digital sine-wave generator and the measuring object, for multiplying the measured signal by the second digital sine wave, and for producing a second analog signal;
a second multiplying type D-A converter, coupled to said digital sine-wave generator and the measuring object, for multiplying the measured signal by the digital cosine wave to produce a third analog signal;
a first integrator, coupled to said first multiplying type D-A converter, for integrating the second analog signal for a period of time which is an integral multiple of the sine wave period; and
a second integrator, coupled to said second multiplying type D-A converter, for integrating the third analog signal for a period of time which is an integral multiple of the sine wave period and for producing a second integrated signal, the first and second integrated signals forming components of the impedance of the measuring object.

13. An impedance measuring apparatus for measuring the impedance of a measuring object, comprising:
a phase accumulator for producing an accumulative output;
digital sine-wave generating means for generating a first digital sine wave, a second digital sine wave and a digital cosine wave based on the accumulative output;
a D-A converter, coupled to said digital sine-wave generating means, for converting the first digital sine wave into a first analog signal which is supplied to the measuring object, the measuring object producing a measured output in response to the first analog signal;
multiplying type D-A conversion means for multiplying the measured output by the second digital sine wave to obtain a second analog signal, and for multiplying the measured output by the digital cosine wave to obtain a third analog signal; and integrating means for integrating the second and third analog signals for a period of time which is an integral multiple of the sine wave period to produce first and second integrated outputs which are components of the impedance of the measuring object.

* * * * *

UNITED STATES PATENT AND TRADEMARK OFFICE
CERTIFICATE OF CORRECTION

PATENT NO. : 4,947,130
DATED : AUGUST 7, 1990
INVENTOR(S) : HITOSHI KITAYOSHI

It is certified that error appears in the above-identified patent and that said Letters Patent is hereby corrected as shown below:

Col. 3, line 25, "showing" should be deleted.

Col. 7, line 47, "$S_{1\ 1\ and\ s2}$" should be --$S_1$ and $S_2$--.

Col. 8, line 23, "detection.integration" should be --detection integration--;

line 36, "$G_x >> \omega C$" should be --$G_x << \omega C$--.

Signed and Sealed this

Twenty-fourth Day of September, 1991

Attest:

HARRY F. MANBECK, JR.

Attesting Officer

Commissioner of Patents and Trademarks